United States Patent
Nakamoto

(10) Patent No.: US 8,289,197 B2
(45) Date of Patent: Oct. 16, 2012

(54) SYSTEM HAVING CORRECTION UNIT AND CORRECTING METHOD THEREOF

(75) Inventor: Hiroyuki Nakamoto, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 48 days.

(21) Appl. No.: 12/946,395

(22) Filed: Nov. 15, 2010

(65) Prior Publication Data

US 2011/0128045 A1 Jun. 2, 2011

(30) Foreign Application Priority Data

Dec. 2, 2009 (JP) .................................. 2009-274086

(51) Int. Cl.
*H03M 1/06* (2006.01)

(52) U.S. Cl. ......... 341/118; 341/117; 341/119; 341/120

(58) Field of Classification Search .................. 341/118, 341/117, 119, 120; 455/296, 234.2
See application file for complete search history.

(56) References Cited

U.S. PATENT DOCUMENTS

| | | | |
|---|---|---|---|
| 6,317,064 B1 * | 11/2001 | Ferrer et al. | 341/118 |
| 6,459,889 B1 * | 10/2002 | Ruelke | 455/296 |
| 6,756,924 B2 * | 6/2004 | Lee et al. | 341/120 |
| 6,888,481 B2 * | 5/2005 | Itoh | 341/118 |
| 2004/0252037 A1 * | 12/2004 | Itoh | 341/118 |

FOREIGN PATENT DOCUMENTS

| | | | |
|---|---|---|---|
| JP | 2000-031824 A | | 1/2000 |
| JP | 2004-222227 A | | 8/2004 |
| JP | 2005-109939 A | | 4/2005 |

* cited by examiner

*Primary Examiner* — Jean B Jeanglaude

(74) *Attorney, Agent, or Firm* — Arent Fox LLP

(57) ABSTRACT

A system has a corrected unit, and a correction unit that performs binary search of a correction value with which an output of the corrected unit gets close to a reference value and feeds back the correction value to the corrected unit. The correction unit performs the additional comparison for comparing a first output of the corrected unit corresponding to a first correction value searched by the binary search and a second output, which is an output of the corrected unit corresponding to a second correction value that is adjacent to the first correction value and is an output that the voltage relationship to the reference value is opposite to the first output, and for selecting the first or second correction value corresponding to the first or second output closer to the reference value, and feeds back the selected correction value to the corrected unit.

21 Claims, 18 Drawing Sheets

BINARY SEARCH
FIG. 2A  OPERATION DIAGRAM
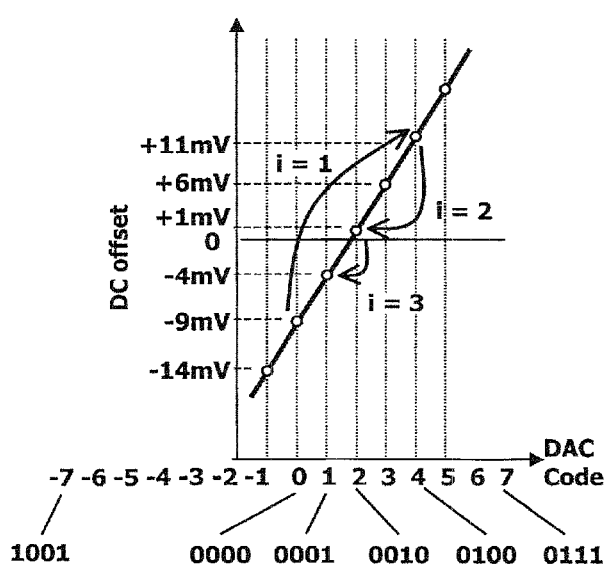
FIG. 2B  FLOW CHART
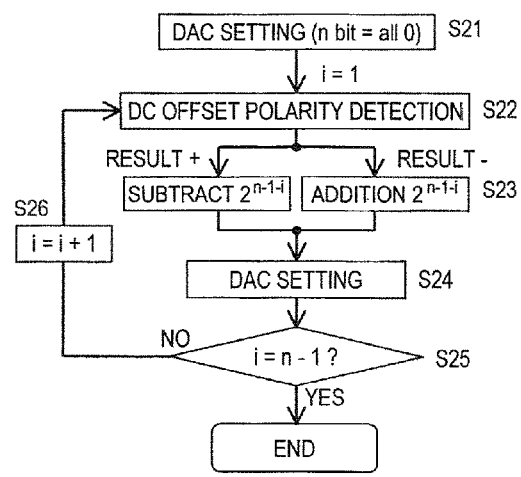

FIG. 3

ADDITIONAL COMPARISON OPERATION (1)

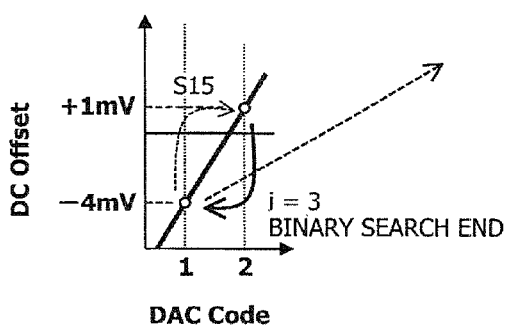

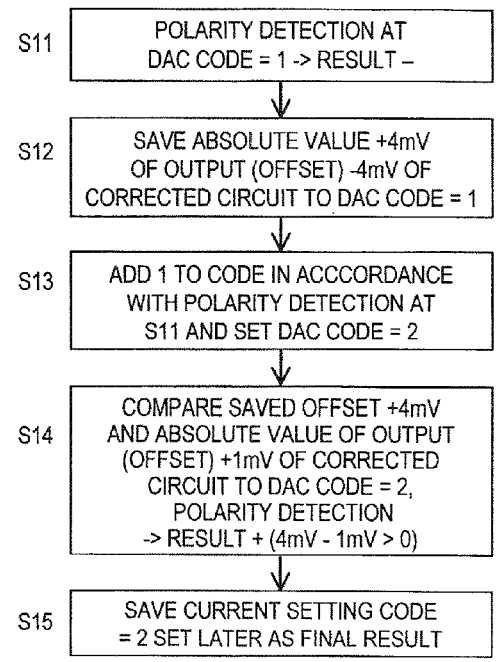

S11 | POLARITY DETECTION AT DAC CODE = 1 -> RESULT −

S12 | SAVE ABSOLUTE VALUE +4mV OF OUTPUT (OFFSET) −4mV OF CORRECTED CIRCUIT TO DAC CODE = 1

S13 | ADD 1 TO CODE IN ACCCORDANCE WITH POLARITY DETECTION AT S11 AND SET DAC CODE = 2

S14 | COMPARE SAVED OFFSET +4mV AND ABSOLUTE VALUE OF OUTPUT (OFFSET) +1mV OF CORRECTED CIRCUIT TO DAC CODE = 2, POLARITY DETECTION -> RESULT + (4mV − 1mV > 0)

S15 | SAVE CURRENT SETTING CODE = 2 SET LATER AS FINAL RESULT

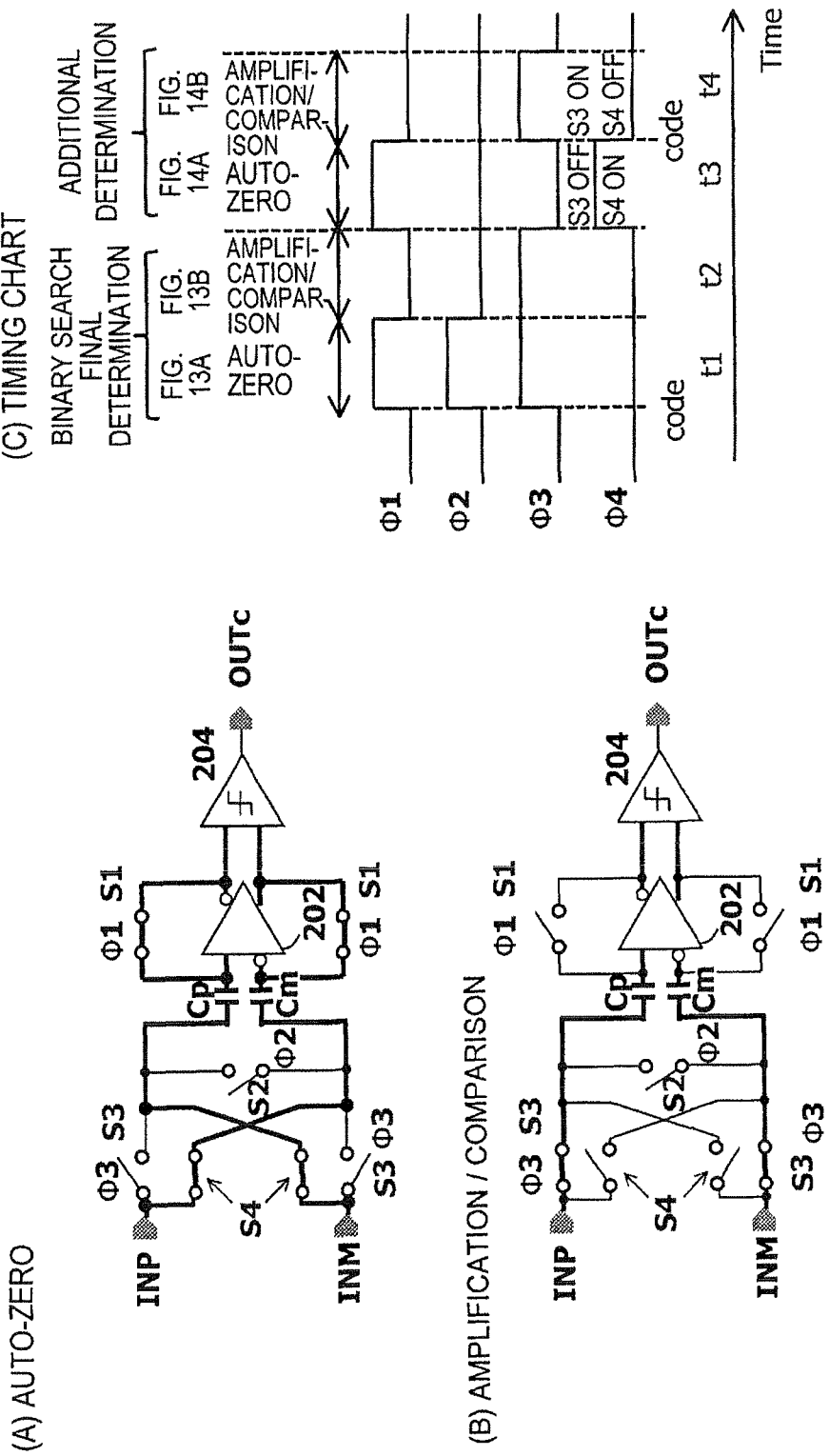

FIG. 15 ADDITIONAL COMPARISON (2)
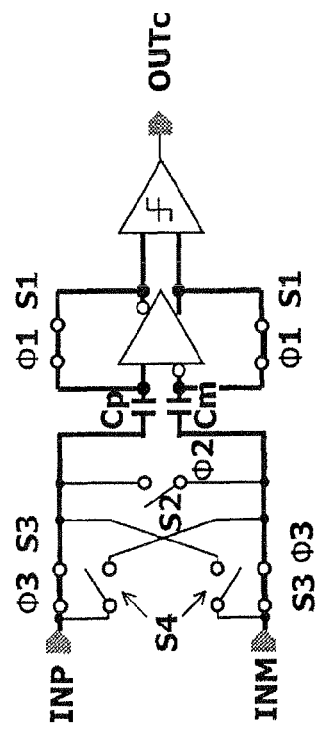
(A) AUTO-ZERO
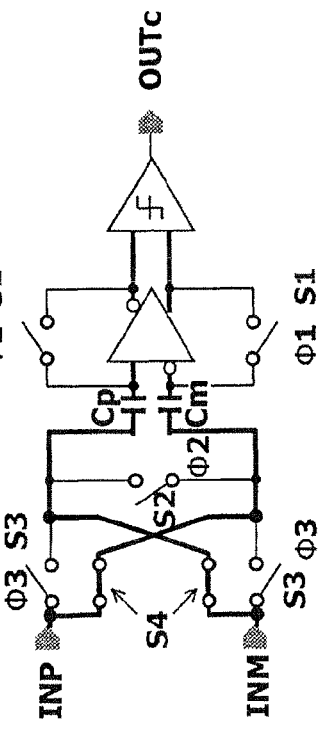
(B) AMPLIFICATION / COMPARISON
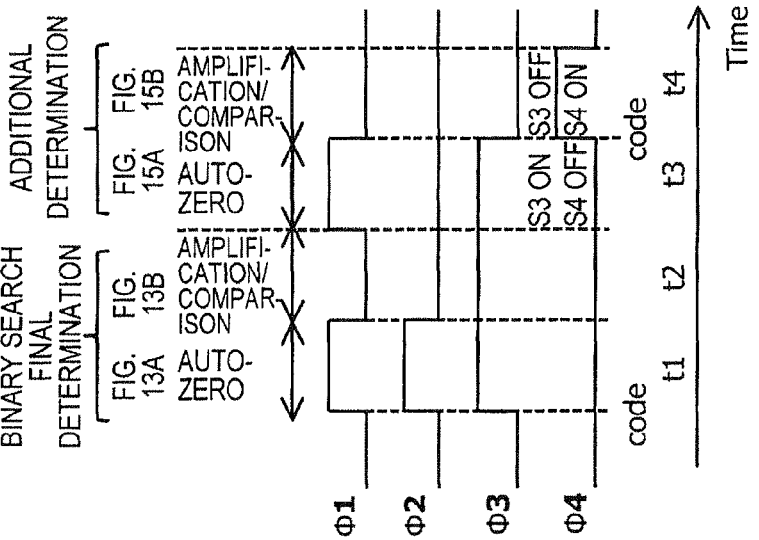
(C) TIMING CHART

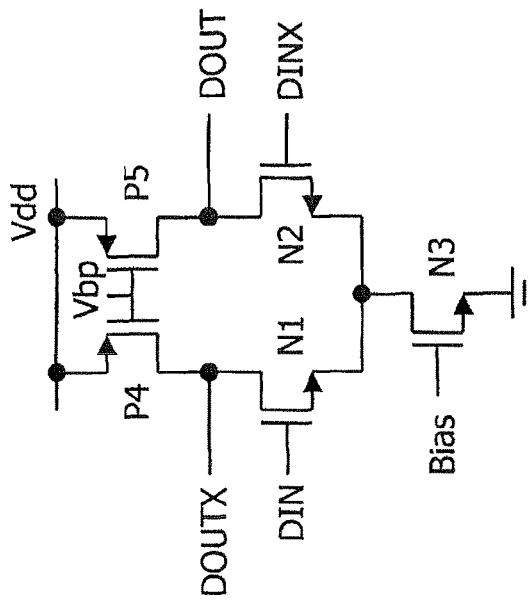
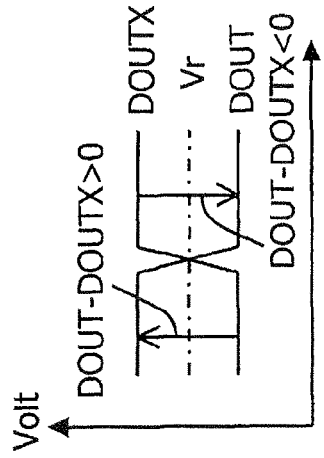
FIG. 18A
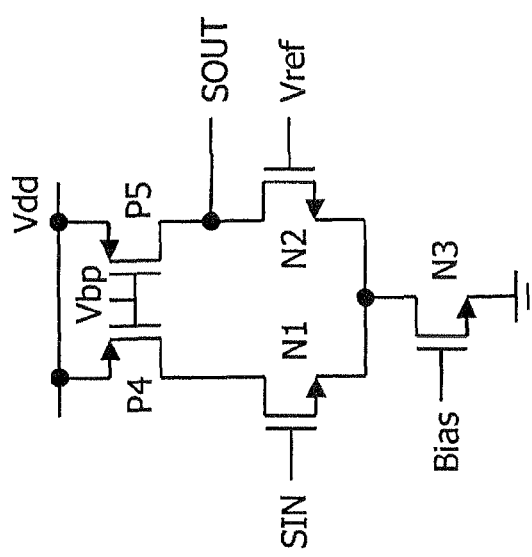
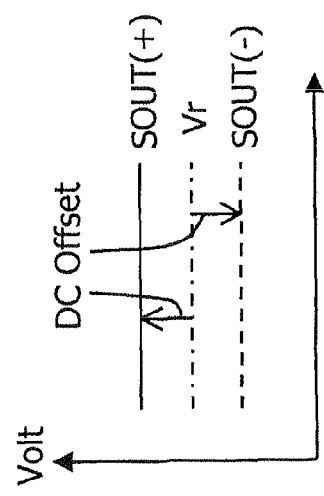
FIG. 18B

SYSTEM HAVING CORRECTION UNIT AND CORRECTING METHOD THEREOF

CROSS-REFERENCE TO RELATED APPLICATION

This application is based upon and claims the benefit of priority of the prior Japanese Patent Application No. 2009-274086, filed on Dec. 2, 2009, the entire contents of which are incorporated herein by reference.

FIELD

The present invention relates to a system having a correction unit and a correcting method thereof.

BACKGROUND

A circuit unit having a operational amplifier and the like requires that, when an input signal is the similar to a reference value, an output signal should also be zero. That is, the voltage difference of the DC-output signal is required to match that of the DC-input signal. However, the circuit unit has a DC offset caused by variation in a manufacturing process, as the pair of transistors that should be equally manufactured become disproportionate.

If the circuit unit inputs and outputs a differential signal, this DC offset is a difference of the differential output signals when the difference of the differential input signals is zero, and if the difference of the differential output signals becomes zero, the DC offset also becomes zero, which is an ideal state.

Such DC offset is generated by a differential amplifier in the circuit unit, for example. The differential amplifier has a pair of input transistors that is driven according to the difference between the input signal and the reference value or the difference of the differential input signals. The pair of input transistors is usually designed with the same size and the layout is arranged symmetrically, but its threshold voltage or transistor size (gate length and gate width) is varied due to the variation in the manufacturing process and the DC offset occurs. If the above-mentioned DC offset occurs in an analog base band circuit in a communication system, carrier leakage is increased, which is not preferable.

Since occurrence of such the DC offset is unavoidable, a correction unit is provided in order to suppress the DC offset as much as possible. In general, the correction unit monitors an output signal of the circuit unit that should be corrected, searches a correction value so that the output signal matches the reference value, and feeds back the correction value to an input terminal or an internal terminal of the circuit unit.

Such suppression of the DC offset as above is described in the following Patent Documents 1, 2, 3 and the like.
Patent Document 1: Japanese Laid-Open No. 2000-31824
Patent Document 2: Japanese Laid-Open No. 2005-109939
Patent Document 3: Japanese Laid-Open No. 2004-222227

A value of the DC offset is different depending on an integrated circuit device having the circuit unit, and a variation range is not known, either. Thus, it is requested that a correction value with which an output matches the reference value as much as possible is searched automatically in a short time while the output of the circuit unit is monitored, and the circuit unit is corrected by the searched correction value.

One of the searching methods of the correction value is a binary search. In the binary search, while the output corresponding to the correction value is compared with the reference value, the correction value is searched by changing the bit from the most significant bit (MSB) to the least significant bit (LSB) of itself. However, a searched result by the binary search is not necessarily the appropriate value, and a correction value that may not be the best might be found in some cases.

SUMMARY

According to an aspect, a system includes a corrected unit, and a correction unit that performs binary search of a correction value with which an output of the corrected unit gets close to a reference value and feeds back the correction value to the corrected unit, wherein the correction unit performs the additional comparison for comparing a first output of the corrected unit corresponding to a first correction value searched by the binary search and a second output, which is an output of the corrected unit corresponding to a second correction value that is adjacent to the first correction value and is an output that the voltage relationship to the reference value is opposite to the first output, and for selecting the first or second correction value corresponding to the first or second output closer to the reference value, and feeds back the selected correction value to the corrected unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 are diagrams illustrating the binary search method.

FIG. 3 is an example for explaining the additional comparison when the correction code at the end of the binary search is "1" (−4 mV) similarly to FIG. 2.

FIG. 14 is a diagram illustrating an operation of the comparator during the additional comparison.

FIG. 15 is a diagram illustrating an operation of the comparator during the additional comparison when differing from FIG. 14.

FIG. 18 are diagrams for explaining an example of the DC offset.

DESCRIPTION OF EMBODIMENTS

Figure 1:
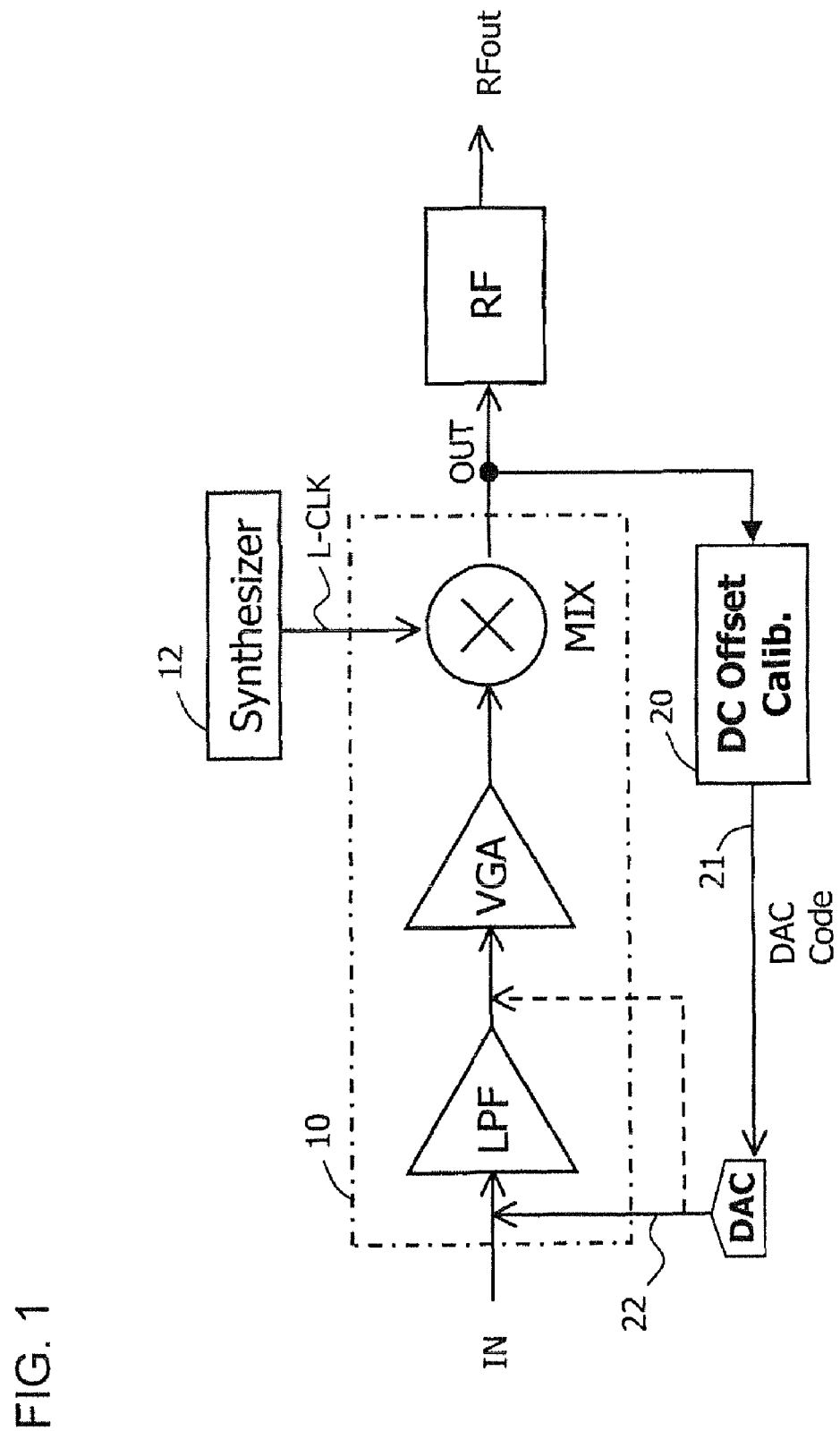
FIG. 1 is a block diagram of a transmitter in this embodiment.

FIG. 1 is a block diagram of a transmitter in a communication system as an example in this embodiment. The transmitter includes an analog baseband circuit composed of a low-pass filter (LPF) to which an analog input IN is inputted and a variable gain amplifier (VGA) that amplifies a filter output, and further includes a mixer (MIX) that multiplies an output of the VGA by a local clock (L-CLK) generated by a synthesizer 12 to up-convert it, and a RF block that outputs a radio-frequency output (RFout) from an output of MIX (OUT).

In the example in FIG. 1, the corrected unit including LPF, VGA, and MIX is expected to have zero voltage at OUT when the input IN is fixed zero voltage. This ideal state means the DC offset of the corrected unit 10 is zero. For example, if IN is a differential input signal and OUT is also a differential output signal, "offset zero" means that the difference of the differential output signals is also zero if the difference of the differential input signals is zero. Alternatively, if IN is a single-phase input and OUT is also a single-phase output, "offset zero" means that the single-phase output also matches the reference value if the single-phase input is the reference value.

FIG. 18 are diagrams for explaining an example of the DC offset. FIG. 18A shows an example of a differential amplifier that outputs the single-phase output SOUT to the single-phase input SIN and includes N-channel input transistor pair N1 and N2, an N-channel current source transistor N3, and P-channel load transistor pair P4 and P5. SIN is inputted to the transistor N1, a reference voltage Vref is inputted to the transistor N2, and SOUT changes into a low or high voltage according to whether the single-phase input SIN is higher or lower than the reference voltage Vref.

Ideally, if SIN is the similar to Vref, the input transistor pair N1 and N2 are balanced, and the single-phase output SOUT matches a output common-mode voltage Vr. However, if threshold voltages or transistor sizes of the input transistor pair N1 and N2 are varied, even if the single-phase input SIN is the similar to the reference voltage Vref, the single-phase output SOUT becomes larger or smaller than the output common-mode voltage Vr. This is the DC offset, and it includes positive offset (SOUT (+) in FIG. 18) and negative offset (SOUT (−) in the same figure) compared with the output common-mode voltage Vr. As mentioned above, the DC offset of the single-phase output is a positive or negative offset according to whether the output SOUT is higher or lower than the output common-mode voltage Vr.

FIG. 18B shows an example of the differential amplifier that outputs differential outputs DOUT and DOUTX to the differential inputs DIN and DINX, and the transistor configuration is the similar to that in FIG. 18A.

Ideally, if the differential inputs DIN and DINX have the same potential, the input transistor pair N1 and N2 are balanced and the differential outputs DOUT and DOUTX match the output common-mode voltage Vr. That is, the difference of the differential outputs is DOUT−DOUTX=0. However, if the threshold voltages or transistor size of the input transistor pair N1 and N2 are varied, even if the differential inputs DIN and DINX are equal, the differential outputs DOUT and DOUTX have the offset of DOUT>DOUTX or DOUT<DOUTX. As mentioned above, the DC offset of the differential output includes positive or negative offset according to whether the difference DOUT−DOUTX is larger or smaller than zero.

Returning to FIG. 1, if the corrected unit 10 is constituted by a semiconductor chip, for example, the DC offset occurs in LPF, VGA, and MIX due to the manufacturing process.

A correction unit 20 monitors the output OUT of the corrected unit 10, while the input IN of the corrected unit 10 is set to the reference voltage Vref (in the case of the single-phase input) or the difference of zero (in the case of the differential input). Then, the supply of the local clock L-CLK of the synthesizer 12 is stopped. The correction unit 20 generates a correction code 21 such that the output OUT gets closer to the reference value, supplies the digital correction code 21 to a digital-to-analog converter DAC and feeds back an analog correction value 22 to an input terminal or an internal node of the corrected unit 10. The correction is performed by the correction unit 20 together with the digital-to-analog converter DAC.

If the corrected unit 10 is a digital circuit, the correction code 21 searched by the correction unit 20 is fed back as it is to a digital input or the internal node of the corrected unit 10.

The correction unit 20 outputs the comparison result on whether the DC offset appearing on the output OUT is positive or negative by comparing the output OUT with the reference value by a built-in comparator. That is, the comparator compares single-phase output signal with the output common-mode voltage, or compares the difference of the differential output signal with Zero. On the basis of the comparison result, the correction unit 20 searches the digital correction code 21.

As for the correction code 21, in the case of a 4-bit digital code, if the DC offset of the corrected unit 10 is changed by a 5 mV per digital code as a DAC resolution, a range of the DC offset that may be corrected by the correction digital code 21 is $2^4 \times 5$ mV=80 mV=±40 mV. Therefore, even if the DC offset of the corrected unit 10 is varied according to chip, the DC offset may be reduced to within 5 mV, when the range of the variation is within the above range.

In order to search the optimal correction code, a method of manually controlling one by one through setting from the outside may be used, but a circuit configuration in which the correction code is searched quickly and automatically by calibration with the correction unit 20 is more preferable.

One of the searching methods of the correction code is binary search. In the binary search, according to whether the output to a median value of the correction code is larger or smaller than the reference value (0 in the case of differential), it is determined if the subsequent lower bit of the correction code is to be added or subtracted. Moreover, according to whether the output to the added/subtracted correction code is larger or smaller than the reference value, it is determined if the subsequent lower bit is to be added or subtracted. This procedure is repeated until the LSB is determined, and the binary search is finished.

FIG. 2 are diagrams illustrating the binary search. FIG. 2A is a graph illustrating a relationship between the DC offset appearing on the output OUT and the correction code of DAC. The correction code is a 4-bit digital code and has from "1001(−7)" as the lowest code to "0111(+7)" as the highest code. The center code is "0000(0)". When the correction code is fed back to the corrected unit 10, the DC offset of the output OUT shows a characteristic having positive inclination, as shown in FIG. 2A. Depending on the feedback circuit, it also shows a negative inclination. When the DC offset is the closest to zero, that is, when the correction code is set to "0010" in FIG. 2A, that shows the optimal correction code.

FIG. 2B is a flowchart of the binary search. Reference character i in the flow chart shows a search order, and the search is sequentially performed from i=1.

The correction digital code is assumed to be the bit number n=4. The input IN is set to the reference potential Vref (the difference is zero in the case of differential), and the correction unit 20 first sets the correction code to "0000" (S21). Then, the DAC in FIG. 1 sets the correction value 22 to the corrected unit 10. The correction code "0000" is the initial state and then the correction value 22 is set to zero. In this state, the correction unit 20 detects the polarity of the DC offset of the output OUT (S22). In the example of FIG. 2A, the DC offset is −9 mV, when the correction code is "0000". That is, the polarity of the DC offset is minus.

Subsequently, the correction unit 20 subtracts or adds the correction code by $2^{n-1-i}$ (S23) and sets the new correction code 21 to DAC (S24). That is, in case of i=1, the correction code obtained by subtracting or adding $2^{4-1-1}=4$ is set to DAC. Since the above polarity was minus, the code 4 is added so as to have the new correction code of "0100". That is, the MSB of the correction code remains as it is, and the subsequent higher bit is set to "1". Since the search order i has not reached n−1(S25), the correction unit 20 sets the search order i to i=i+1(S26) and detects the polarity to the changed DAC code again (S22).

The correction unit 20 repeats the above processes (S22 to S25), until the search order i reaches n−1=4−1=3. The binary search will be specifically explained below referring to FIG. 2.

At the search order i=1, the DC offset is −9 mV with the correction code "0000" as mentioned above, and the comparator in the correction circuit 20 detects the minus polarity (S22) and as a result, the correction circuit 20 makes a change to increase the correction code so that the DC offset becomes plus (S23). If the correction code is 4 bits, it becomes "0100" that is the half of the variable range. In this case, the DC offset is added with the offset corresponding to the code value 4 (=0100), which is +20 mV, and the DC offset of the output OUT becomes −9 mV+20 mV=+11 mV.

Subsequently, at the search order i=2, the comparator in the correction circuit 20 detects the polarity plus to the DC offset +11 mV, and the correction circuit 20 changes the correction code so as to decrease the DC offset. In this case, the subtracted code is "0010"=2 obtained by shifting the code when i=1 to 1 bit low side. This code value "2" corresponds to −10 mV of the DC offset, so the new DC offset becomes +11 mV−10 mV=+1 mV.

At the search order i=3, the comparator detects the polarity plus to the DC offset +1 mV, and the correction circuit 20 changes the correction code so as to decrease the DC offset. The subtraction code is "0001"=1 obtained by shifting the code to 1 bit low side. In this case, the code value 1, that is, 5 mV is subtracted, and the DC offset becomes −4 mV. At this time, (=3)=n−1(=3) is satisfied (S25), and the binary search is finished. In this way, the optimal correction code "0001" is detected by this binary search method.

As mentioned above, the binary search is performed more efficiently as the bit number of DAC is increased, because the search repetition is n−1 times not 2.

However, if the search is started with the correction code of an even-number code, the search is finished with an odd-number code, or vice versa. In the example in FIG. 2, the search is started with the even-number code "0000", and the searched correction code "0001" (−4 mV) is an odd-number code. Also, in this example, it is obvious that the best correction code is not the searched "0001(−4 mV)" but "0010(+1 mV)". In this way, even if there is an optimal value on the way of the search, the search is continued to the LSB and thus, the correction code searched by the binary search does not necessarily become the best value.

In this embodiment, after the above-mentioned binary search, a first output of the corrected unit corresponding to a first correction value searched by the binary search and a second output, which is an output of the corrected unit corresponding to a second correction value that is adjacent to the first correction value and which has the voltage relationship to the reference value is opposite to that of the first output are compared, and additional comparison is performed to select the first or the second correction value corresponding to the first or second output closer to the reference value. The correction value selected in this additional comparison may be the optimal correction value.

Figure 4:
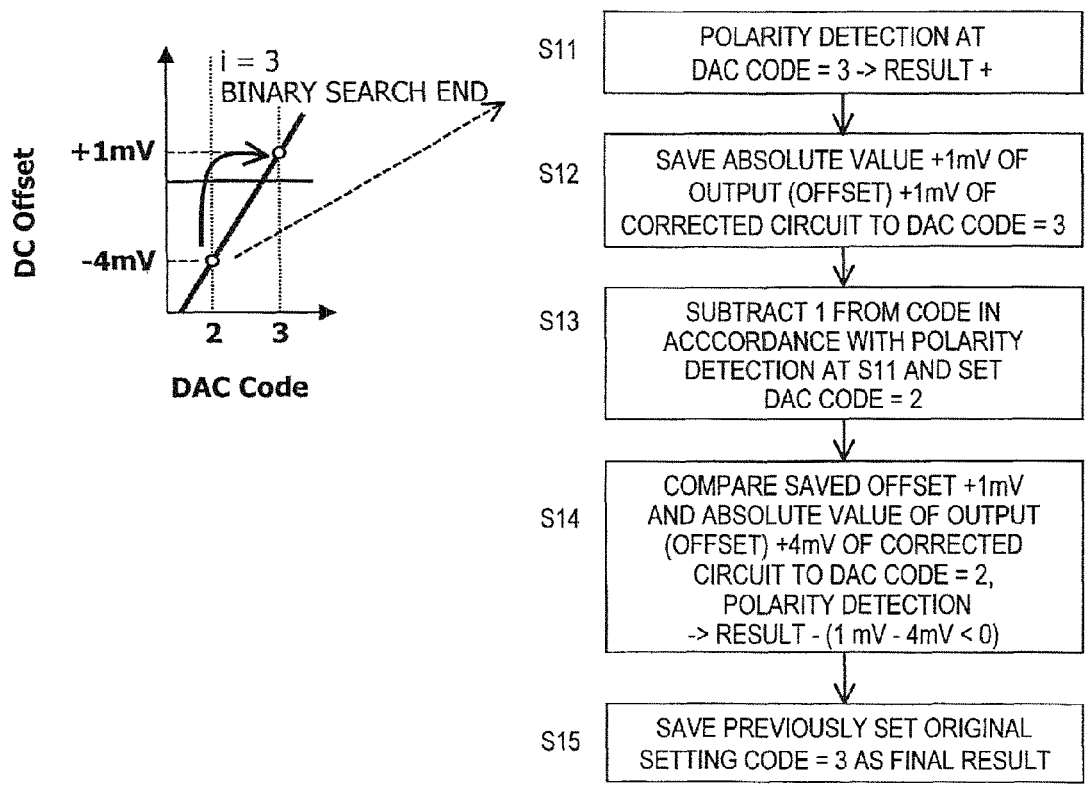
FIG. 4 is an example for explaining the additional comparison when the correction code at the end of the binary search is "3" (+1 mV), which is different from FIG. 2.

FIGS. 3 and 4 are diagrams for explaining the additional comparison after the binary search in this embodiment. FIG. 3 is an example for explaining the additional comparison when the correction code at the end of the binary search is "1" (−4 mV) similarly to FIG. 2, while FIG. 4 is an example for explaining the additional comparison when the correction code at the end of the binary search is "3" (+1 mV), which is different from FIG. 2. The DC offset to the correction code is an example of a characteristic with positive inclination.

In the example in FIG. 3, after the binary search finishes (S11), the correction unit 20 detects the polarity of the DC offset −4 mV corresponding to the odd-number correction code "1 (0001)". The result of the polarity detection is minus. Then, the correction unit 20 saves the absolute value 4 mV of this DC offset −4 mV (S12).

Subsequently, since the polarity of S11 is minus, the correction unit 20 sets the correction code "2 (0010)" as the adjacent code, in order to determine if the DC offset of the correction code "2 (0010)" which is larger than the current correction code "1 (0001)", is smaller or not (S13). The polarity of the DC offset to this correction code "2 (0010)" has been already known by the binary search to be plus.

Then, the correction unit 20 compares the absolute value 4 mV of the DC offset corresponding to the saved correction code "1 (0001)" and the absolute value 1 mV of the DC offset +1 mV corresponding to the current correction code "2 (0010)" (S14). This comparison may be performed by subtracting the absolute value 1 mV from the absolute value 4 mV by the same comparator. As the result, it is found out that the absolute value 1 mV is closer to the reference value zero and also known that the DC offset to the correction code "2 (0010)" obtained by the additional comparison is smaller than that of the correction code "1 (0001)" obtained by the binary search. The correction unit 20 feeds back the currently set correction code "2 (0010)" as the final correction code to the corrected unit 10 through the DAC (S15). As a result, the DC offset is corrected to the smallest +1 mV.

In the example in FIG. 4, after the binary search finishes (S11), the correction unit 20 detects the polarity of the DC offset +1 mV corresponding to the odd-number correction code "3 (0011)". The result of the polarity detection is plus. Then, the correction unit 20 saves the absolute value 1 mV of this DC offset +1 mV (S12).

Subsequently, since the polarity of S11 is plus, the correction unit 20 sets the correction code "2 (0010)" as the adjacent code, in order to determine if the DC offset of the correction code "2 (0010)" which is smaller than the current correction code "3 (0011)" is smaller or not (S13). The polarity of the DC offset to this correction code "2 (0010)" has been already known by the binary search to be minus.

Then, the correction unit 20 compares the absolute value 1 mV of the DC offset corresponding to the saved correction code "3 (0011)" and the absolute value 4 mV of the DC offset −4 mV corresponding to the current correction code "2 (0010)" (S14). This comparison also may be performed by subtracting the absolute values. As the result, it is found out that the absolute value 1 mV is closer to the reference value zero and also known that the DC offset to the correction code "3 (0011)" obtained by the binary search is smaller than that of the correction code "2 (0010)" obtained by the additional comparison. The correction unit 20 feeds back the correction code "3 (0011)" of the binary search result as the final correction code to the corrected unit 10 through the DAC (S15). As a result, the DC offset is corrected to the smallest +1 mV similarly to the result after the binary search.

Figure 5:
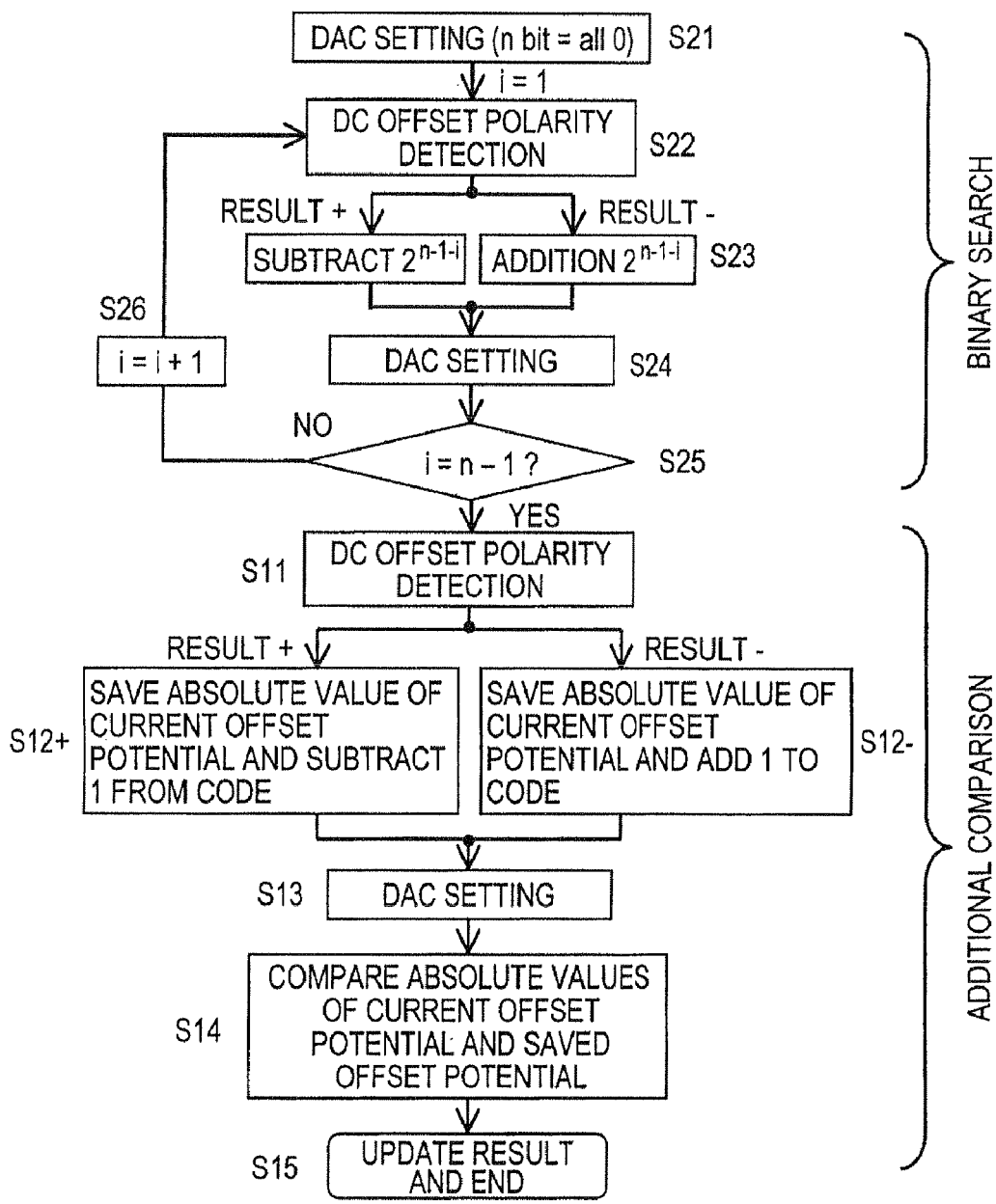
FIG. 5 is a flowchart of the DC offset correction in this embodiment.

FIG. 5 is a flowchart of the DC offset correction in this embodiment. In the DC offset correction in this embodiment, after the binary search processes S21 to S26 shown in FIG. 2 are performed, the additional comparison processes S11 to s15 shown in FIGS. 3 and 4 are performed.

The binary search processes S21 to S26 in FIG. 5 are the similar to in FIG. 2. Also, the additional comparison from S11 to S15 in FIG. 5 is the similar to in FIGS. 3 and 4. The polarity detection of S11 is performed by use of the DC offset appearing at the output OUT with the correction code of the binary search result. According to this result, if the polarity is plus (+), the correction code is subtracted by 1(S12+), while if the polarity is minus (−), the correction code is added by 1 (S12−). When the polarity is plus, the second correction code that is adjacent to the low side of the first correction code of the binary search result might be an optimal value. On the other hand, when the polarity is minus, the second correction code that is adjacent to the high side of the first correction code of the binary search result might be an optimal value. The second correction code is set to the DAC (S13), the absolute value of the DC offset corresponding to the second correction code and the absolute value of the saved DC offset are compared (S14), and the correction code of the DC offset with the smaller absolute value is determined to be the final correction code (S15).

The DC offset correction of this embodiment will be described below using a specific circuit as an example. In the circuit example below, the comparator of the correction unit performs the polarity detection of the DC offset in the binary search and also performs the subtraction of two absolute values in the additional comparison. Moreover, the comparator in the correction unit may perform the polarity check and the subtraction while canceling its own DC offset.

Figure 6:
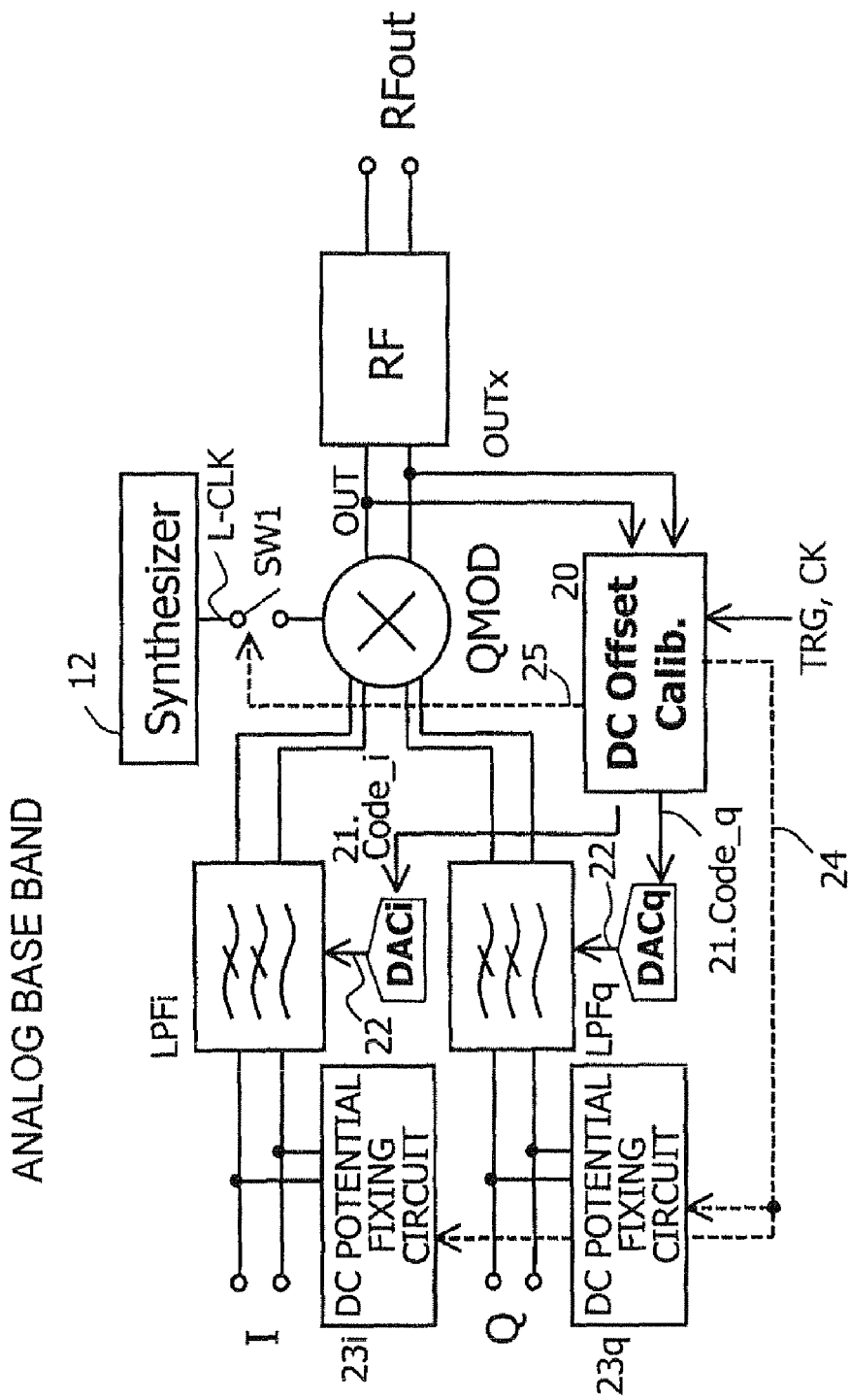
FIG. 6 is a block diagram of a transmitter with the correction unit of this embodiment.

FIG. 6 is a block diagram of a transmitter with the correction unit of this embodiment. This transmitter has, an analog base-band which is composed of low-pass filters LPFi and LPFq that suppress a high-frequency noise of an I/Q differential signals, a quadrature modulator QMOD that mixes output signals of the filters and a local clock L-CLK generated by the synthesizer 12, and a RF circuit that amplifies a modulation signal and generates a RFout to be transmitted.

In this transmitter, the low-pass filters LPFi and LPFq and the quadrature modulator QMOD have a circuit having an input transistor pair, and have a DC offset caused by manufacturing process variation. Then, the correction unit 20 monitors the differential output signals OUT and OUTx of the quadrature modulator QMOD, and generates the correction code 21 that minimizes the DC offset of the differential output signals OUT and OUTx.

The correction unit 20 intercepts the input of the Q-side signal to the quadrature modulator QMOD while fixing the potential of the differential input signal on the I side to the reference value by a DC potential fixing circuit 23i, and stops the local clock L-CLK of the synthesizer 12, and searches a correction code Code_i which the differential output signals OUT and OUTx of the QMOD becomes the minimum value. Similarly, the correction unit 20 intercepts the input of the signal on the I side to the QMOD while fixing the potential of the differential input signal on the Q side to the reference value by a DC potential fixing circuit 23q, and stops the local clock L-CLK of the synthesizer 12, and searches a correction code Code_q which the differential output signals OUT and OUTx of the QMOD becomes the minimum value. The DC potential fixing circuits 23i and 23q may be set a differential potential to zero, and a simple example is a switch to short-circuit between the differential input terminal pair.

Also, the correction unit 20 detects the DC offset of the corrected unit including the low-pass filters and the quadrature modulator. The DC offset is obtained by a potential difference which is generated in the differential output signal of the QMOD, while I/Q inputs are zero. When the potential difference of OUT and OUTx becomes zero, it means that the DC offset is zero.

Also, the respective correction codes Code_i and Code_q are converted to analog correction signals by the DACi and the DACq, they are fed back to the low-pass filters LPFi and LPFq. When the correction code has 4 bits and a resolution is 5 mV per digital code, a correction range becomes $2^4 \times 5$ mV=80 mV=±40 mV. That is, it is assumed that the total of the DC offset generated by the LPF and the QMOD is −15 mV, the differential output signals OUT and OUTx may be controlled to zero by outputting +3 (0011) as the correction code to the DAC.

In the correction mode, the I-side correction code Code_i and the Q-side correction code Code_q are searched and set to the DAC independently. As shown in FIG. 6, during the correction, the supply of the local clock to the QMOD is stopped by a switch SW1. When the correction of the DC offset is finished, the DC potential fixing circuits 23i and 23q are stopped, the local clock L-CLK of the synthesizer 12 to the QMOD is supplied, and the transmitter is returned to an operation state. At this time, the setting code to the DAC detected in the correction mode is saved.

The control of the correction mode is performed by the correction unit 20. The correction unit 20 performs switching control between the correction mode and the operation mode of the corrected unit, and between the binary search and the additional comparison after that, by use of a trigger signal TRG indicating start of the correction mode and a control clock CK.

Figure 7:
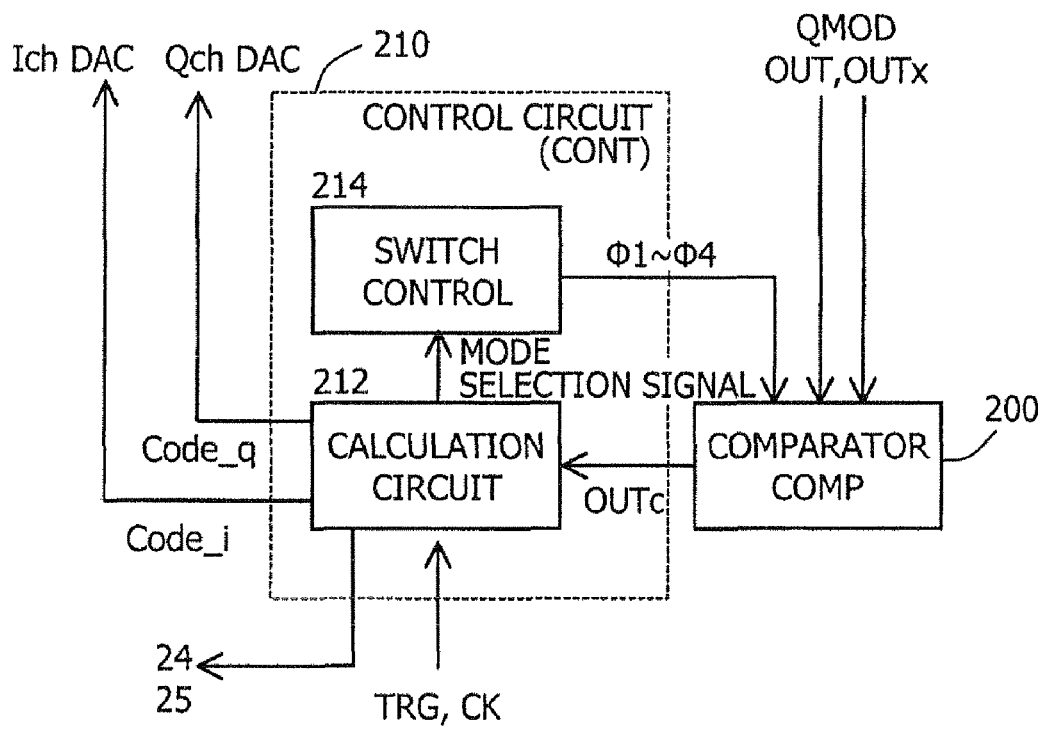
FIG. 7 is a block diagram of the correction unit 20 in this embodiment.

FIG. 7 is a block diagram of the correction unit 20 in this embodiment. The correction unit 20 has a comparator 200 that compares the differential outputs OUT and OUTx of the QMOD, a calculation circuit 212 that calculates the correction codes Code_q and Code_i according to the comparison result of the comparator 200 and controls the operation mode, and a switch control unit 214 that generates control signals φ1 to φ4 for controlling a switch group in the comparator 200 according to a mode selection signal from the calculation circuit. The trigger signal TRG starting the correction control and a synchronization clock CK are inputted to the calculation circuit 212, and this circuit generates a control signal 24 of the DC potential fixing circuit and a control signal 25 of a local-clock supply switch of the synthesizer. As mentioned above, the control circuit 210 controls the binary search and the additional comparison, considering the comparison result of the comparator 200.

Figure 8:
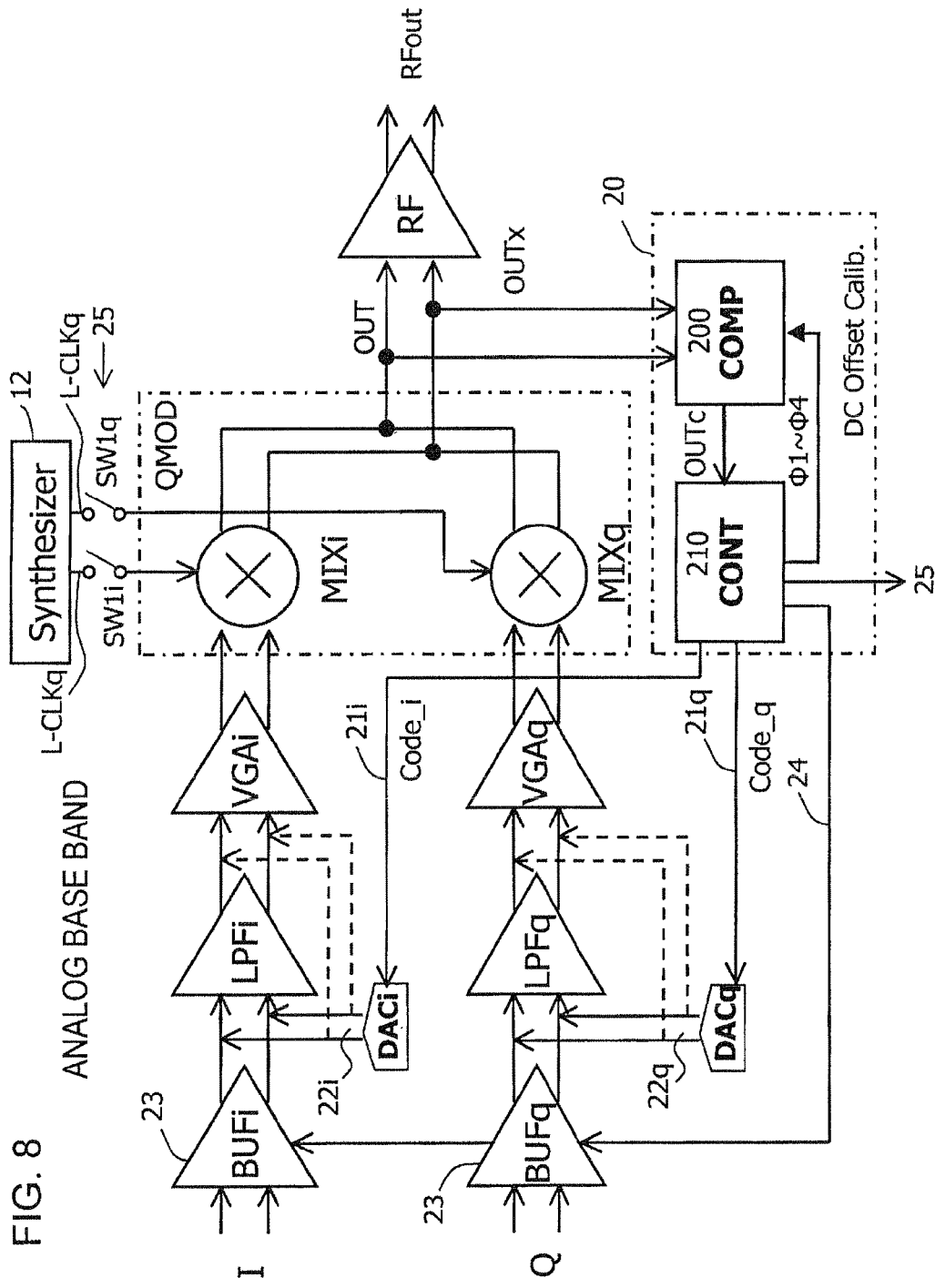
FIG. 8 is a specific block diagram of the transmitter in FIG. 6.

FIG. 8 is a specific circuit block diagram of the transmitter in FIG. 6. The same reference numbers are given to corresponding portions. In FIG. 8, the DC potential fixing circuits 23i and 23q in FIG. 6 correspond to buffers BUFi and BUFq that short-circuit differential signal terminals of the differential input signals I and Q respectively. Also, the low-pass filters LPFi and LPFq in FIG. 6 correspond to the low-pass filters LPFi and LPFq and voltage gain amplifiers VGAi and VGAq that amplify the outputs of the filters. Moreover, the QMOD in FIG. 6 correspond to I-channel side and Q-channel side mixers MIXi and MIXq and a configuration which couples their outputs. Also, FIG. 8 has switches SW1$i$ and Swig that supply local clocks L-CLKi and L-CLKq with different phases by $\pi/2$ to the mixers, respectively.

Then, in FIG. 8, an analog correction value 22$i$ of an I-channel side digital-to-analog converter DACi is added to an input pair or an output pair of the low-pass filter LPFi. Similarly, an analog correction value 22$q$ of a Q-channel side digital-to-analog converter DACq is added to an input pair or an output pair of the low-pass filter LPFq.

Figure 9:
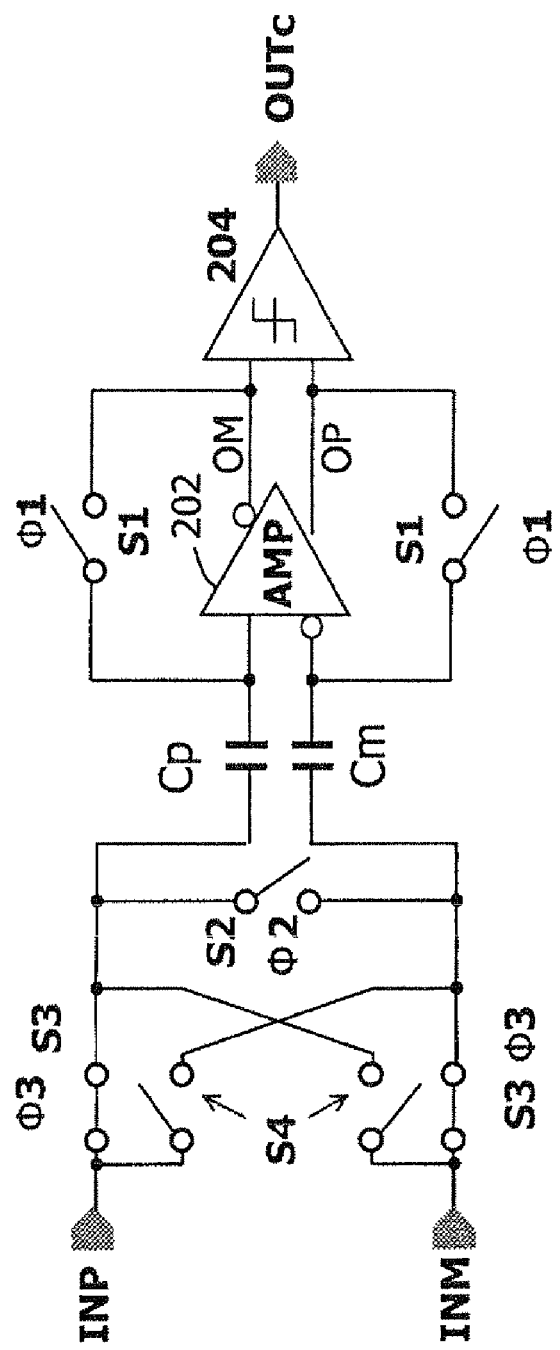
FIG. 9 is a circuit diagram of the comparator in the correction unit 20 in this embodiment.

FIG. 9 is a circuit diagram of the comparator in the correction unit 20 in this embodiment. This comparator 200 has a pair of input differential terminals INP and INM, a differential amplifier 202 that inputs INP and INN through a pair of input capacitances Cp and Cm and outputs OP and OM, the input-output switches S1 that are disposed between an input and an output of the differential amplifier 202 and connect the output pair to the input pair in reversely, and input switches S3 and S4 that connect the pair of input terminals INP and INM to the pair of input capacitances Cp and Cm in a straight coupling or a cross coupling. Moreover, the comparator 200 has an input-pair switch S2 that short-circuits the differential input signals INP and INN and short-circuits an electrode of one of the pair of input capacitances Cp and Cm. Also, the comparator 200 has a converter 204 that converts the differential outputs OP and OM of the differential amplifier 202 to a binary digital signal OUTc.

In the binary search phase, this comparator 200 may determine if the difference of the differential input singles INP and INM is larger or smaller than the reference zero by canceling the DC offset of the differential amplifier 202 itself. Moreover, in the additional comparison phase, the comparator 200 may also determine which of the absolute values of the first and second outputs are optimal. This operation will be described later in detail.

Figure 10:
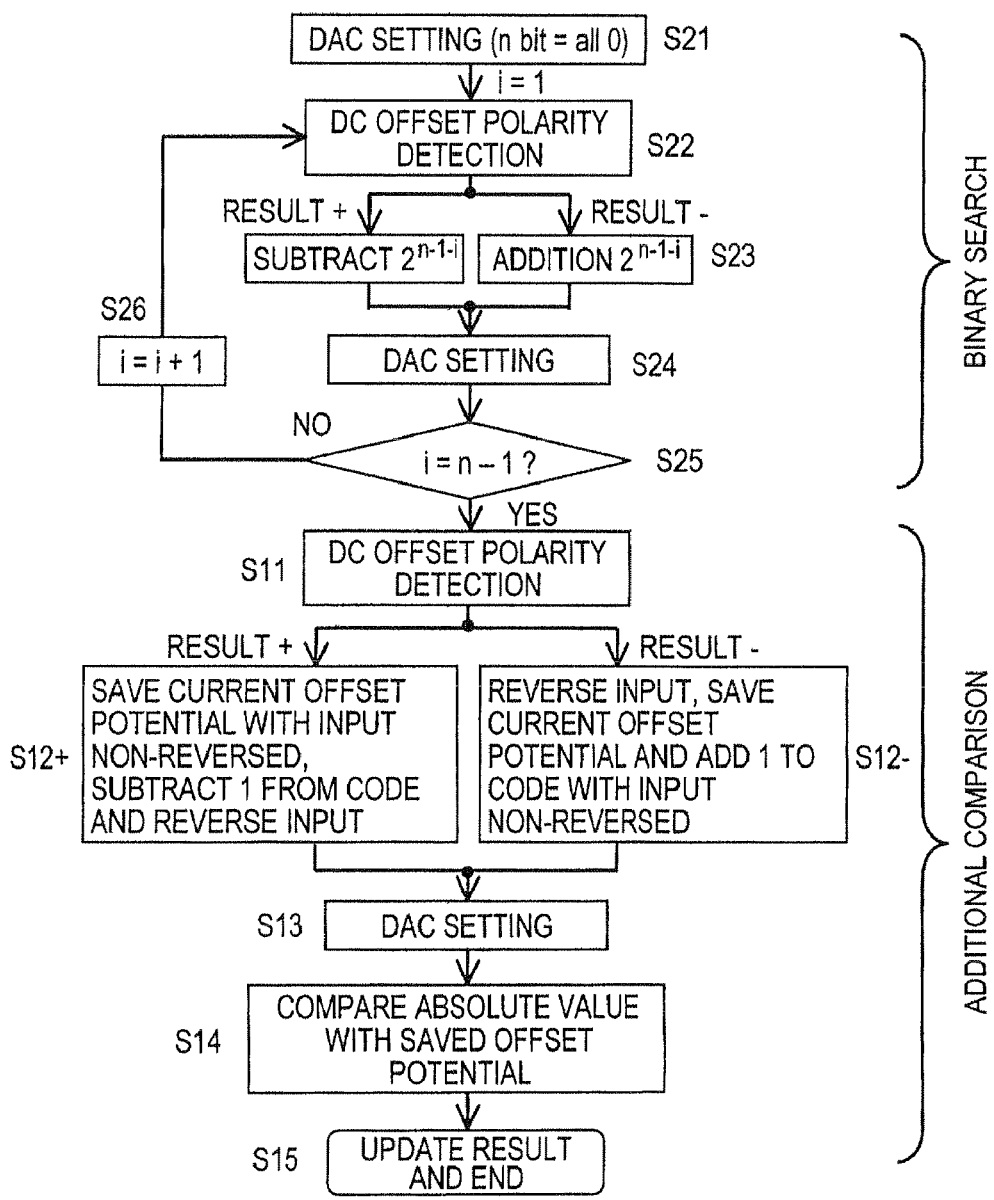
FIG. 10 is a flowchart of the DC offset correction in this embodiment.

FIG. 10 is a flowchart of the DC offset correction in this embodiment. This flowchart shows a correction process when the correction process shown in the flowchart in FIG. 5 is performed using the comparator in FIG. 9. With that, the binary search processes S21 to S26 in FIG. 10 are the similar to in FIG. 5, but the additional comparison processes S11 to S15 in FIG. 10 are partially different from FIG. 5.

Figure 11:
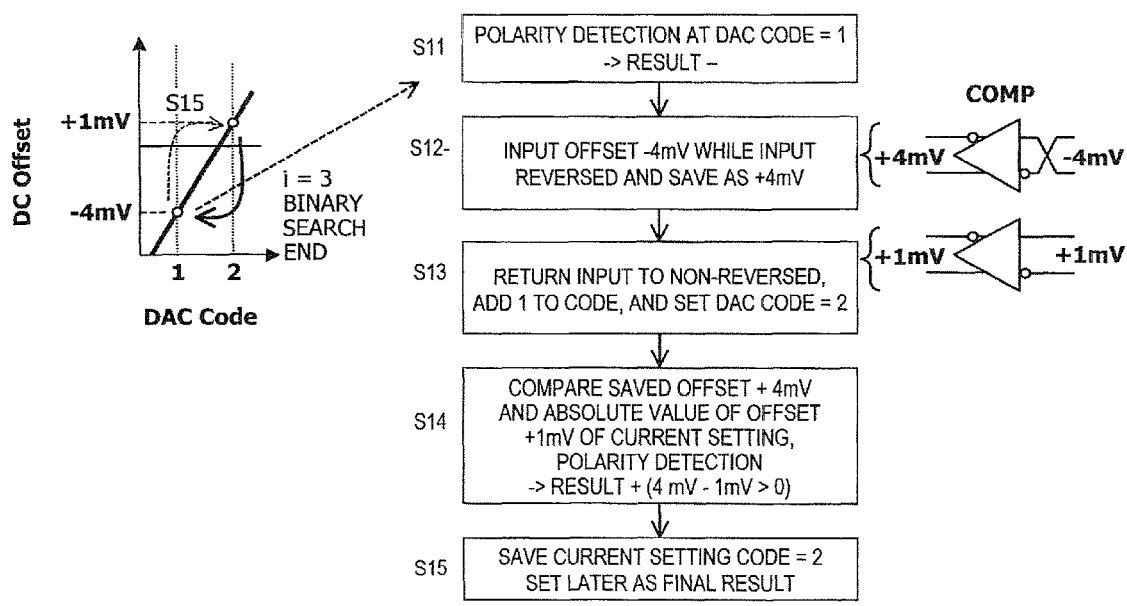
FIG. 11 is flowchart of the additional comparison after the binary search in this embodiment.
Figure 12:
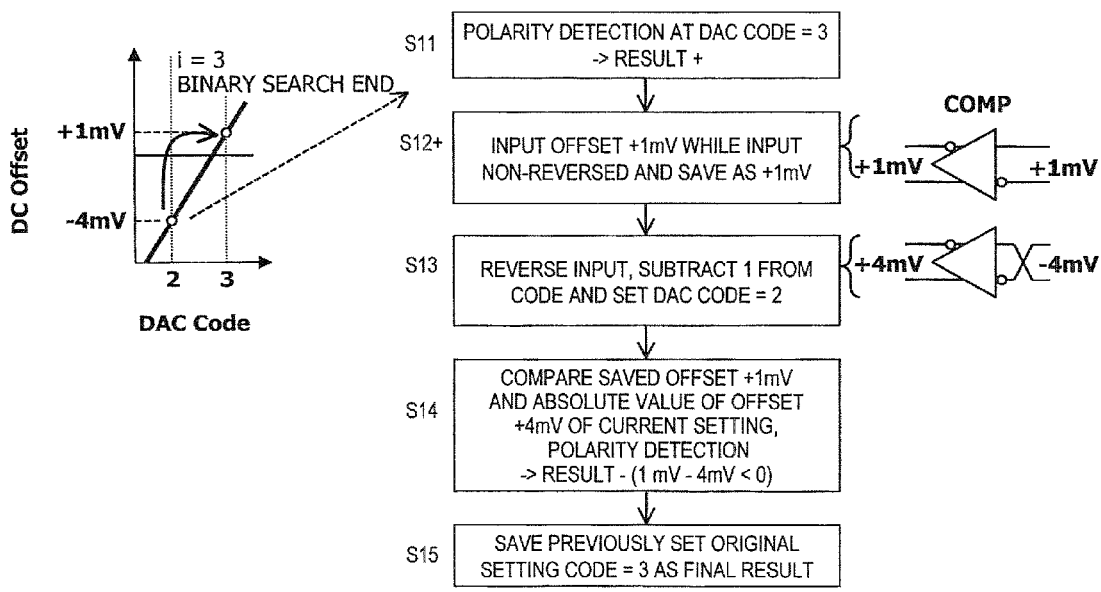
FIG. 12 is flowchart of the additional comparison after the binary search when differing from FIG. 11.

FIGS. 11 and 12 are flowcharts of the additional comparison after the binary search in this embodiment. This flowchart shows an additional comparison process when the additional comparison shown in FIGS. 3 and 4 is performed using the comparator in FIG. 9.

Figure 13:
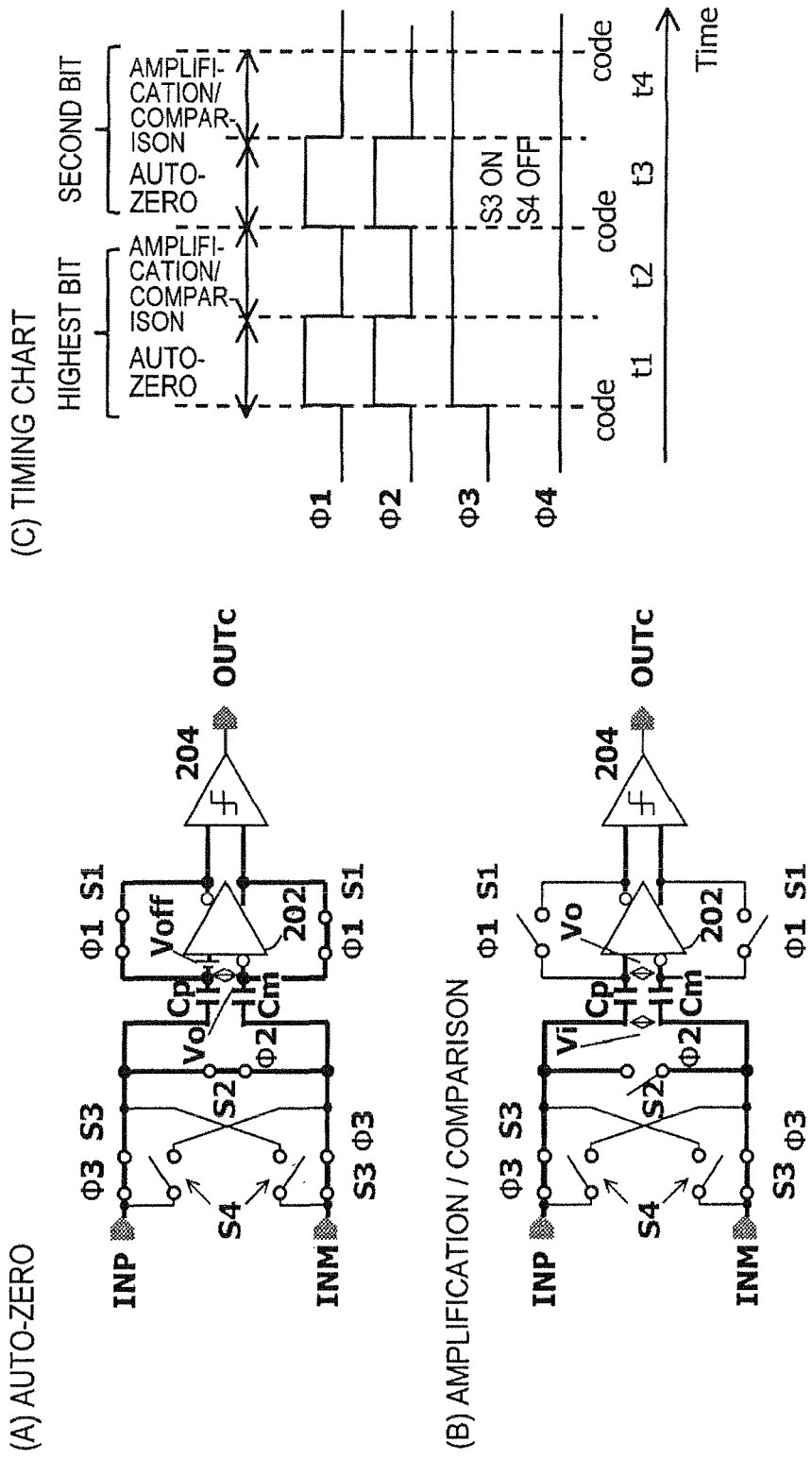
FIG. 13 is a diagram illustrating an operation of the comparator during the binary search.

FIG. 13 is a diagram illustrating an operation of the comparator during the binary search. FIGS. 14 and 15 are diagrams illustrating an operation of the comparator during the additional comparison.

The correction process when the comparator in FIG. 9 is used will be described below referring to FIGS. 10 to 15. First, the binary search processes S21 to S26 in FIG. 10 are the similar to the binary search processes S21 to S26 in FIGS. 2 and 5. However, the process S22 for the polarity detection of the DC offset is performed by the operation of the comparator shown in FIG. 13.

At the process S22 in the binary search, the polarity of the outputs OUT and OUTx of the corrected unit when a correction code is set are determined. As described in FIG. 2, according to whether the polarity of this DC offset is positive or negative, the calculation process S23 for the correction code to be set subsequently is performed. The polarity detection of this DC offset is performed by the comparator in FIG. 9.

FIG. 13 shows a polarity detection process by the comparator. This comparator has (A) auto-zero mode and (B) amplification/comparison mode. As shown in a timing chart of the operation in (C) of FIG. 13, the polarity detection for each bit in the correction code is performed through the auto-zero mode at times t1 and t3 and the amplification/comparison mode at the times t2 and t4.

First, in the (A) auto-zero mode, it is controlled such that the input-output switch S1, the input switch S2 and S3 are set to ON, and S4 is set to OFF. In this state, the input/output of the differential amplifier 202 is short-circuited, and the differential input signals INP and INN are also short-circuited. Here, it assumes that a DC offset Voff is present in the differential amplifier 202. In the example of (A) of FIG. 13, the DC offset of +Voff is present on the positive side of the differential amplifier 202. In this auto-zero mode, since the input-output switch S1 of the differential amplifier 202 is ON, the output of the differential amplifier Vo=OP−OM becomes equal to the input of the differential amplifier. Here, when a gain of the differential amplifier is A, the differential amplifier generates an output Vo by amplifying a differential input voltage obtained by adding the DC offset Voff to the reversed output Vo with the gain A, the following equation becomes true:

$$(-Vo+Voff) \times A = Vo \quad (1)$$

From this equation, the output Vo is:

$$Vo = A * Voff/(1+A) \quad (2)$$

Since the gain A of the differential amplifier is usually A>>1 such as 200, the above equation (2) becomes:

$$Vo \approx Voff \quad (3)$$

That is, in this auto-zero state, an electric charge corresponding to the offset voltage Voff is accumulated in the input capacitances Cp and Cm. The comparator is controlled to the subsequent (B) amplification/comparison mode, while the offset voltage Voff is maintained. In mode (B), it is controlled such that the input-output switch S1, the input switch S2, and S4 are OFF, and only the input switch S3 is ON.

If the mode is changed from the auto-zero state which the terminals of the INP and INM have the equal potential by S2 to the amplification/comparison mode which the differential voltage Vi is inputted, the differential potential Vi appears on the input of the differential amplifier by conservation of electric charge. On the other hand, since the charge corresponding to Voff accumulated during the auto-zero is conserved between the input terminals of capacitance Cp and Cm, the potential of Vi+Voff appears on the input of the differential amplifier. However, since the Voff is the potential originally maintained in the auto-zero, the sensed potential by the differential amplifier is the exactly given differential voltage Vi. Therefore, the differential amplifier may amplify only the change of the input differential voltage Vi by eliminating the offset voltage Voff of the differential amplifier itself. And the differential outputs OP and OM of the differential amplifier 202 are converted to 1-bit digital value of 0 or 1 by the converter 204 and is outputted as OUTc to the calculation circuit 212 of the control circuit 210.

As shown in the timing chart of (C) of FIG. 13, the polarity detection of the DC offset during the binary search is performed from the MSB to LSB sequentially In the (A) auto-zero mode, the switches S1, S2, and S3 are turned on by a high level of the control signals φ1, φ2, and φ3, and the switch S4 is turned off by a low level of φ4. Also, in the amplification/comparison mode, only the switch S3 is turned on by the control signal φ3, while the other switches S1, S2, and S4 are turned off.

Then, as shown in FIG. 10, the binary search is started with the polarity detection of the output signal for the all-zero correction code. The polarity result is outputted to the calculation circuit 212, a new correction code is set by either one of the process S23 according to the polarity, and the state of the digital-to-analog converter DAC is updated. The similar process is repeated until the LSB of the correction code.

Subsequently, referring to FIGS. 11 and 14, the operation of the additional comparison will be described. The additional comparison (1) in FIG. 11 corresponds to the above-mentioned FIG. 3. First, the polarity of the DC offset of the corrected unit for the correction code "1" is detected with the setting of the binary search mode. The setting of the comparator is shown in the (A) auto-zero and (B) amplification/comparison in FIG. 13. The timing chart is shown in FIG. 14. The polarity detection of the final code found by the binary search is performed at the time t1 and t2 in (C) of FIG. 14. In the example of FIG. 11, since the DC offset of the correction code "1" which is the final code found by the binary search is −4 mV, the polarity result is minus.

Then, the comparator is controlled to the (A) auto-zero mode in FIG. 14 corresponding to the state at the time t3 in FIG. 14(C). That is, the switches S1 and S4 are set to ON, S2 and S3 are set to OFF. Since the above-mentioned polarity (S11) in FIG. 11 is minus, the differential input signals INP and INM of the cross coupling (S4 in FIG. 14) are enable in order to form the absolute offset voltage. As a result, the +4 mV of the DC offset potential for the correction code "1" is maintained in the input capacitances Cp and Cm of the comparator, and the offset Voff of the comparator is also maintained because of the auto zero by S1 switch (S12 in FIG. 11). In this (A) auto-zero state of FIG. 14, when Vin is equal to VINP−VINM, since the polarity of the input Vin1=−4 mV is reversed, the following equation becomes true as in the above equation (1):

$$(-Vin1 - Vo + Voff) \times A = Vo \qquad (4)$$

From this equation, the output Vo is:

$$Vo = A(-Vin1 + Voff)/(1+A) \qquad (5)$$

Since it is usually A>>1, the above equation (5) becomes:

$$Vo \approx Vin1 + Voff \qquad (6)$$

The electric charge corresponding to this voltage (−Vin1+Voff) is accumulated between the input terminals of capacitances Cp and Cm.

Subsequently, the comparator is controlled to the (B) amplification/comparison mode in FIG. 14 corresponding to the state at the time t4 in FIG. 14 (C). That is, the switches S1 S2 and S4 are set to OFF, the input switch S3 is only set to ON. Since the above-mentioned polarity (S11) in FIG. 11 is minus, code 1 is added to the current correction code to set the adjacent code with different polarity. In this case, the differential input signals INP and INM of the straight coupling (S3 in FIG. 14) are enable by the above-mentioned minus polarity (S11) in FIG. 11 in order to form the absolute offset voltage. The changed correction code is "2", and the DC offset to the correction code "2" named Vin2 is +1 mV. The Vin2 is applied to the differential input of the comparator (S13 in FIG. 11). In this case, since the electric charge in the auto-zero is accumulated the following equation is applied to the input terminal of the differential amplifier 202:

$$Vi = (-Vin1 + Voff) - Vin2 \qquad (7)$$

Since the charge corresponding to −Vin1+Voff (equation 6) is the potential originally maintained in the auto-zero, the sensed potential by the differential amplifier is the exactly given differential voltage (−Vin1−Vin2). As a result, the offset voltage Voff is cancelled, the differential amplifier 202 amplifies (−Vin1−Vin2), that is, 4 mV−1 mV=3 mV, and generates the outputs OP and OM. By determining the polarity of the difference of the outputs OP and OM (that is, plus in this example), the subtraction between absolute values of the correction codes "1" and "2" may be performed (S14 in FIG. 11). In the example in FIG. 11, since the result of the absolute-value comparison is plus, the Vin2=+1 mV has a smaller absolute value, and instead of the correction code "1" found in the binary search, the adjacent correction code "2" is determined as the optimal correction code. The DC offset at that time is +1 mV. And the correction code "2" is saved as the final result (S15 in FIG. 11).

Next, referring to FIGS. 12 and 15, the operation of the other additional comparison will be described. This additional comparison (2) in FIG. 12 corresponds to the above-mentioned FIG. 4. First, the polarity of the DC offset +1 mV for the correction code "3" found in the binary search is detected (S11 in FIG. 12). The polarity is plus.

Then, the comparator is controlled to the (A) auto-zero mode in FIG. 15 corresponding to the state at the time t3 in FIG. 15 (C). That is, the switches S1 and S3 are set to ON, S2 and S4 are set to OFF. Since the above-mentioned polarity (S11) in FIG. 12 is plus, the differential input signals INP and INN of the straight coupling (S3 in FIG. 15) are enable in order to form the absolute offset voltage. As a result, the electric charge corresponding to the DC offset potential +1 mV for the correction code "3" is maintained in the input capacitances Cp and Cm of the comparator, and the electric charge corresponding to the offset Voff of the comparator is also maintained because of the auto zero by S1 switch (S12 in FIG. 12). That is, since it is Vin1=+1 mV, the following equation becomes true similarly to the above equation (4):

$$(Vin1 - Vo + Voff) \times A = Vo \qquad (8)$$

From this equation, the output Vo is:

$$Vo \approx Vin1 + Voff \qquad (9)$$

The electric charge corresponding to this voltage (Vin1+Voff) is accumulated between the input terminals of capacitances Cp and Cm.

Subsequently, the comparator is controlled to the (B) amplification/comparison mode in FIG. 15 corresponding to the state at the time t4 in FIG. 15 (C). That is, the switches S1, S2 and S3 are set to OFF, and the input switch S4 is only set to ON. Since the above-mentioned polarity (S11) in FIG. 12 is plus, code 1 is subtracted from the current correction code to set the adjacent code with different polarity. In this case, the differential input signals INP and INN of the cross coupling (S4 in FIG. 15) are enable by the above-mentioned plus polarity (S11) in FIG. 12 in order to form the absolute offset voltage. The changed correction code is "2", and the DC offset to the correction code "2" named Vin2 is −4 mV. The Vin2 is applied to the differential input of the comparator (S13 in FIG. 12). In this case, since the electrical charge in the auto-zero is accumulated the following equation is applied to the input terminal of the differential amplifier 202:

$$Vi = (Vin1 + Voff) - (-Vin2) \qquad (10)$$

As well as the above-mentioned, the offset voltage Voff is cancelled, the differential amplifier 202 amplifies (Vin1+ Vin2), that is, 1 mV+(−4 mV)=−3 mV, and generates the outputs OP and OM. By determining the polarity of the difference of the outputs OP and OM (that is, minus in this example), the subtraction between absolute values of the correction codes "3" and "2" may be performed (S14 in FIG. 12). In the example in FIG. 12, since the result of the absolute-value comparison is minus, instead of the correction code "2", the correction code "3" found in the binary search is determined as the optimal correction code. The DC offset at that time is +1 mV. And the correction code "3" is saved as the final result (S15 in FIG. 12).

As mentioned above, by using the comparator in FIG. 9, while the DC offset of the comparator itself is present, the polarity detection in the binary search and the absolute-value comparison of the two adjacent correction codes may be performed accurately. As a result, in the additional comparison, the comparator may determine which of the first correction code searched in the binary search or the second correction code that is adjacent to the first correction code and has the different polarity is the optical correction code.

Figure 16:
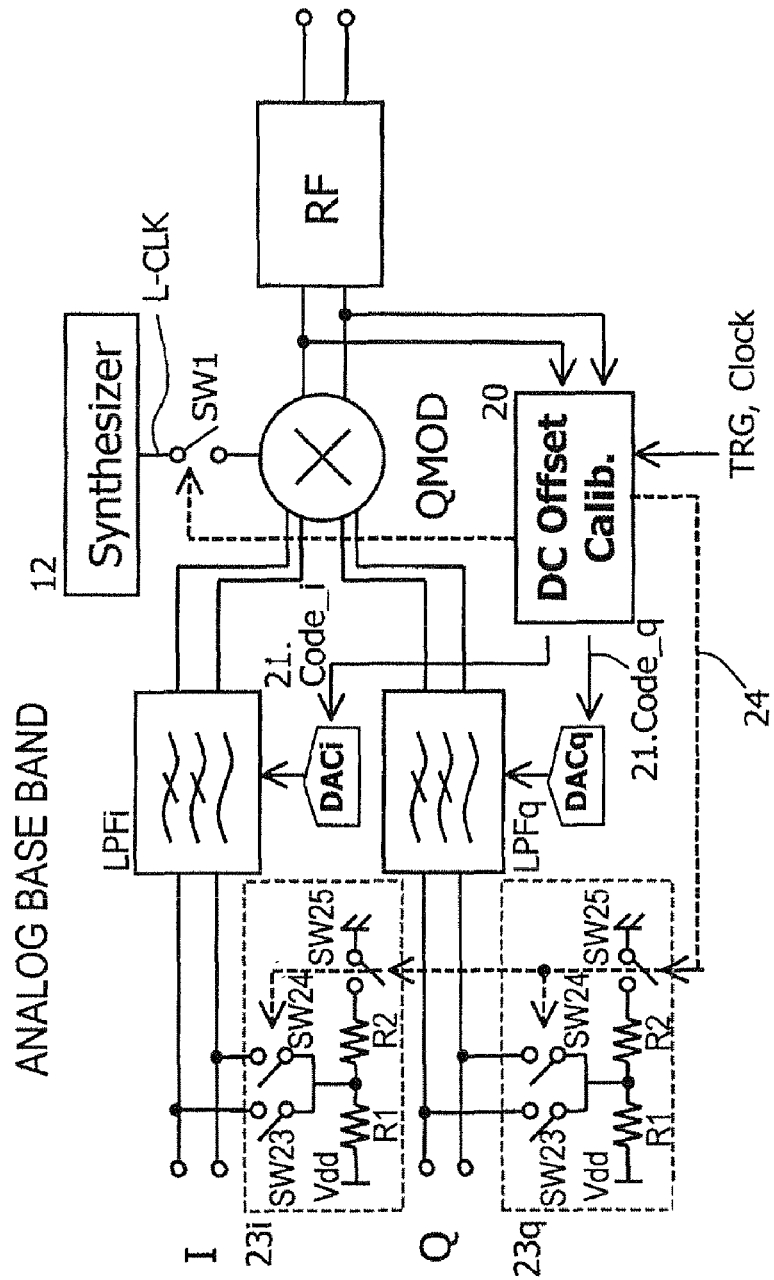
FIG. 16 is a block diagram illustrating a transmission system with the correction unit in this embodiment.

FIG. 16 is a block diagram illustrating a transmitter with the correction unit in this embodiment. The transmitter in FIG. 16 is different from the transmitter in FIG. 6 in a point that the configurations of the DC potential fixing circuits 23$i$ and 23$q$ are specifically described. According to the above-described explanation, the DC potential fixing circuits 23$i$ and 23$q$ include switches that short-circuit differential signals of the I channel and the Q channel.

However, only short-circuiting the differential signals by the short-circuit switch to set the difference value to zero is not enough, in the case of a large potential fluctuation in an external terminal, for example. In such case, the differential signals of the I and Q channels are largely fluctuated. If the DC offset correction is performed in such a situation, the differential potential of the differential signal is changed by an influence of the coupling capacitance of the short-circuit switch or ON-resistance, and the potential difference may not be fully set to zero. As a result, there is a possibility that the DC offset potential appearing on the output of the quadrature modulator QMOD is slightly fluctuated.

Then, in the transmitter in FIG. 16, the DC potential fixing circuits 23$i$ and 23$q$ have resistors R1 and R2 coupled in series between a power source Vdd and the ground, a switch SW 25, and switches SW 23 and SW 24 between a coupling node of the resistors R1 and R2 and differential signal lines of the I and Q channels. Then, the correction unit 20 controls the switches SW 23, SW 24 and SW 25 by a control signal 24 in the DC offset correction mode. As a result, the potential of the differential signal lines of the I and Q channels is forcedly fixed to a resistor divided-voltage potential by the low impedance resistors R1 and R2. By having such DC potential fixing circuit, even if a large potential change occurs outside, the potential fluctuation may be suppressed, the potential difference of the differential signal line may be maintained appropriately at zero, a noise in the differential component is suppressed, and DC offset correction may be performed with high accuracy.

Figure 17A:
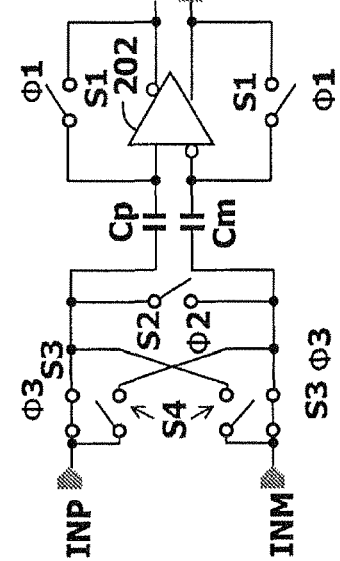
FIG. 17 is a diagram illustrating a variation of the comparator in this embodiment.

FIG. 17 is a block diagram illustrating a variation of the comparator in this embodiment. The operation will be described in the comparator shown in FIG. 9. In FIG. 17A, the converter following the differential amplifier 202 is not provided and either one of the differential outputs is performed as a comparator output. If the gain of the differential amplifier 202 is sufficiently high, the differential output becomes either of the maximum potential or the minimum potential, so without necessarily providing a converter, the result of the comparator may be obtained by determining either one of the differential outputs as the high level or the low level.

Figures 17B, 17C:
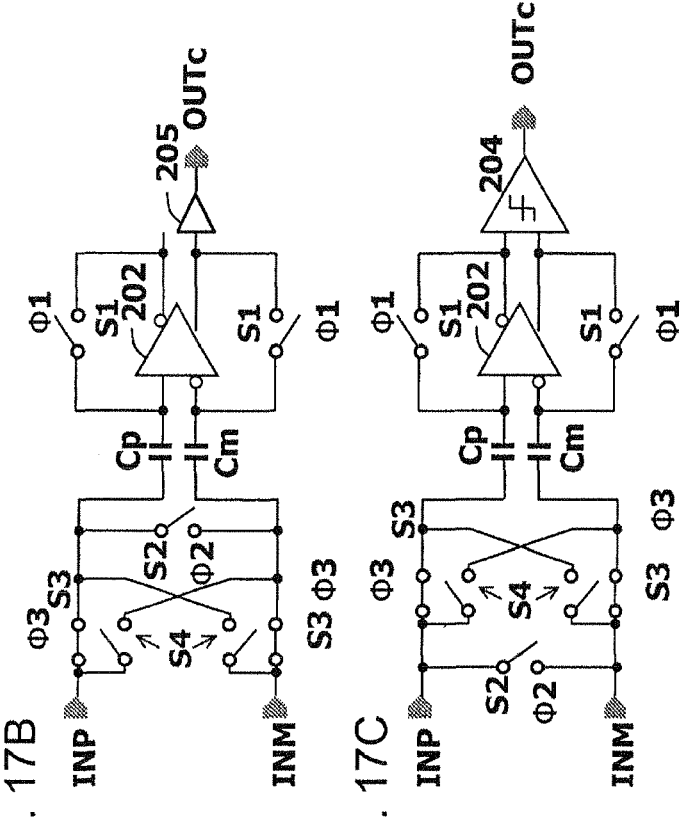
Figure 17D:
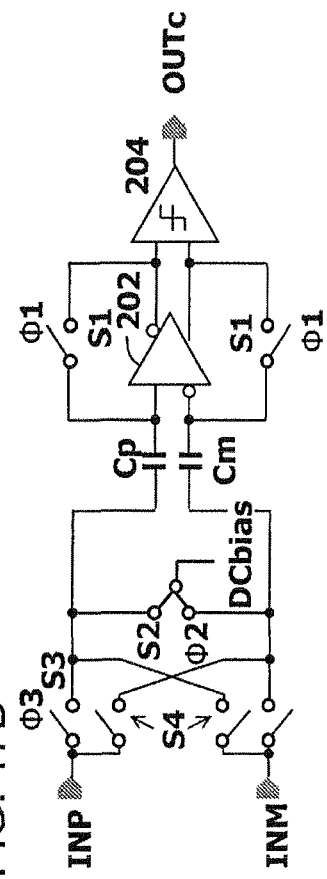

FIG. 17B shows an example that an amplifier 205, not the converter 204, is provided in the following stage of the differential amplifier 202. Due to the reason similar to the above, either one of the differential outputs of the differential amplifier 202 may be amplified to the high or the low level by the amplifier 205.

In FIG. 17C, the short-circuit switch S2 is provided between the input terminals of the differential input signals INP and INM. Also, in FIG. 17D, the short-circuit switch S2 is coupled to the differential input signals and a constant bias voltage.

Other than the above, various variations obvious to those skilled in the art who embodies the function of the comparator of this embodiment may be employed for the correction unit of this embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

The invention claimed is:

1. A system comprising:
a target unit to be corrected; and
a correction unit configured to perform binary search of a correction value with which an output of the target unit gets closer to a reference value and feeds back the correction value to the target unit, wherein
the correction unit is configured to perform additional comparison for comparing a first output of the target unit and a second output of the target unit and for selecting a first or second correction value corresponding to the first or second output closer to the reference value, the first output corresponding to the first correction value searched by the binary search, the second output corresponding to the second correction value that is adjacent to the first correction value, a voltage relationship to the reference value of the second output being opposite to that of the first output,
wherein the correction unit is configured to feed back the selected correction value to the target unit.

2. The system according to claim 1, wherein
the correction unit determines either one of a pair of correction values adjacent to the first correction value as the second correction value, according to the voltage relationship between the reference value and the first output in the additional comparison.

3. The system according to claim 1, wherein
the correction unit compares a first absolute value, which is a difference between the first output and the reference value, and a second absolute value, which is a difference between the second output and the reference value, in the additional comparison, and selects the first or second correction value corresponding to the first or second output having the smaller absolute value by use of the result of the additional comparison.

4. The system according to claim 3, wherein
the target unit outputs a differential output signal as the output; and
the correction unit outputs a difference of the differential signals of the first output as the first absolute value, and also outputs a difference of the differential signals of the second output as the second absolute value.

5. The system according to claim 4, wherein
the correction unit includes:
a comparator having a pair of input terminals to which the differential output signals of the target unit are inputted, a differential amplifier to which the differential output signals inputted to the pair of input terminals are inputted through a pair of input capacitances and which drives an output according to a difference of the differential output signals, an input-output switch disposed between an input and an output of the differential amplifier, and an input switch that couples the pair of input terminals to the pair of input capacitances by a straight coupling of a normal phase or a cross coupling of a reverse phase; and
a control unit that controls the input-output switch and the input switch of the comparator and generates the correction value according to an output of the comparator, wherein
the comparator has a first mode in which the input-output switch is turned on, and a differential signal of the first output is inputted with the normal phase or the reverse phase, and a second mode in which the input-output switch is turned off, and the differential signal of the second output is inputted with the reverse phase or the normal phase opposite to that of the first mode; and
the control unit determines a comparison result of the first and second absolute values according to the output of the comparator in the second mode.

6. The system according to claim 5, wherein
the comparator further has an input-pair switch disposed between an input pair of the differential amplifier; and
in the first mode of the comparator, the input-pair switch is set to off.

7. The system according to claim 5, wherein
the comparator further has an input-pair switch disposed between an input pair of the differential amplifier; and
in the first mode of the comparator, the input switch is set to either the normal phase or the reverse phase according to the polarity of a difference of the differential output signal of the first output to the first correction value searched in the binary search, and the input-pair switch is set to off.

8. The system according to claim 5, wherein
in the binary search, in a comparison mode in which the input-output switch is turned off, the input switch is set to either the normal phase or the reverse phase, and the differential output signal of the target unit is inputted to the differential amplifier, the control unit determines the voltage relationship of the differences of the differential output signals of the target unit based on an output of the differential amplifier and searches a plurality of bits of the correction values on the basis of the comparison result.

9. The system according to claim 8, wherein
the comparator further has an input-pair switch disposed between the input pair of the differential amplifier; and
in the binary search, after an auto-zero mode in which the input-output switch and the input-pair switch are turned on, the comparator is controlled to the comparison mode, and in the comparison mode, the input-pair switch is set to off.

10. The system according to claim 1, wherein
the target unit outputs a differential signal according to a differential input signal; and
the correction unit searches a correction value with which a difference of the differential output signal becomes the smallest while a difference of the differential input signal unit is maintained at zero potential.

11. A system comprising:
a target unit to be corrected and to which a differential signal is inputted and which outputs a differential signal; and
a correction unit configured to perform binary search of a correction value such that a difference of the differential output signal outputted when a difference of the differential input signal has zero potential gets closer to a reference value zero and feeds back the correction value to the target unit, wherein
the correction unit is configured to perform additional comparison for comparing a first differential output signal of the target unit and a second differential output signal of the target unit, and for selecting a first or second correction value corresponding to the first or second differential output signal with the difference being closer to the reference value zero, the first differential output signal corresponding to the first correction value searched by the binary search, the second differential output signal corresponding to the second correction value that is adjacent to the first correction value, a voltage relationship of the second differential output signal being opposite to that of the first differential output signal,
wherein the correction unit is configured to feed back the selected correction value to the target unit.

12. The system according to claim 11, wherein
the correction unit includes:
a comparator having a pair of input terminals to which differential output signals of the target unit are inputted, a differential amplifier to which the differential output signals inputted to the pair of input terminals are inputted through a pair of input capacitances and which drives an output according to a difference of the differential output signals, an input-output switch disposed between an input and an output of the differential amplifier, an input switch that couples the pair of input terminals to the pair of input capacitances by a straight coupling of a normal phase or a cross coupling of a reverse phase, and an input-pair switch disposed between the pair of input terminals; and
a control unit that controls the input-output switch, the input switch, and the input-pair switch of the comparator and generates the correction value according to an output of the comparator, wherein
the comparator has a first mode in which the input-output switch is turned on, the input-pair switch is turned off, and a differential signal of the first output is inputted with the normal phase or the reverse phase, and a second mode in which the input-output switch and the input-pair switch are turned off, and the differential signal of the second output is inputted with the reverse phase or the normal phase opposite to that of the first mode; and
the control unit determines a comparison result of the first and second absolute values according to the output of the comparator in the second mode.

13. The system according to claim 12, wherein
the control unit has, in the binary search, an auto-zero mode in which the input-output switch and the input-pair switch are turned off and a comparison mode in which the input-output switch and the input-pair switch are turned off, and the differential output signal of the target unit is inputted with the reverse phase or the normal phase opposite to that of the first mode to the differential amplifier, the control unit, in the comparison mode, determines the voltage relationship of the differences of the differential output signals of the target unit based on an output of the differential amplifier and searches a plurality of bits of the correction values on the basis of the comparison result.

14. A correcting method for a target unit in which an output of the target unit is monitored and a correction value to be fed back to the target unit is searched, comprising:
a binary search in which a correction value with which an output of the target unit gets closer to a reference value is binary-searched;
an additional comparison in which a first output of the target unit is compared with a second output, which is an output of the target unit and a first or second correction value corresponding to the first or second output closer to the reference value is selected, the first output corresponding to the first correction value searched by the binary search, the second output corresponding to the second correction value that is adjacent to the first correction value, a voltage relationship to the reference value of the second output being opposite to that of the first output; and
a feedback in which the selected correction value is fed back to the target unit.

15. The system according to claim 2, wherein
the correction unit compares a first absolute value, which is a difference between the first output and the reference value, and a second absolute value, which is a difference between the second output and the reference value, in the additional comparison, and selects the first or second correction value corresponding to the first or second output having the smaller absolute value by use of the result of the additional comparison.

16. The system according to claim 15, wherein
the target unit outputs a differential output signal as the output; and
the correction unit outputs a difference of the differential signals of the first output as the first absolute value, and also outputs a difference of the differential signals of the second output as the second absolute value.

17. The system according to claim 16, wherein
the correction unit includes:
a comparator having a pair of input terminals to which the differential output signals of the target unit are inputted, a differential amplifier to which the differential output signals inputted to the pair of input terminals are inputted through a pair of input capacitances and which drives an output according to a difference of the differential output signals, an input-output switch disposed between an input and an output of the differential amplifier, and an input switch that couples the pair of input terminals to the pair of input capacitances by a straight coupling of a normal phase or a cross coupling of a reverse phase; and
a control unit that controls the input-output switch and the input switch of the comparator and generates the correction value according to an output of the comparator, wherein
the comparator has a first mode in which the input-output switch is turned on, and a differential signal of the first output is inputted with the normal phase or the reverse phase, and a second mode in which the input-output switch is turned off, and the differential signal of the second output is inputted with the reverse phase or the normal phase opposite to that of the first mode; and
the control unit determines a comparison result of the first and second absolute values according to the output of the comparator in the second mode.

18. The system according to claim 17, wherein
the comparator further has an input-pair switch disposed between an input pair of the differential amplifier; and
in the first mode of the comparator, the input-pair switch is set to off.

19. The system according to claim 18, wherein
the comparator further has an input-pair switch disposed between an input pair of the differential amplifier; and
in the first mode of the comparator, the input switch is set to either the normal phase or the reverse phase according to the polarity of a difference of the differential output signal of the first output to the first correction value searched in the binary search, and the input-pair switch is set to off.

20. The system according to claim 19, wherein
in the binary search, in a comparison mode in which the input-output switch is turned off, the input switch is set to either the normal phase or the reverse phase, and the differential output signal of the target unit is inputted to the differential amplifier, the control unit determines the voltage relationship of the differences of the differential output signals of the target unit based on an output of the differential amplifier and searches a plurality of bits of the correction values on the basis of the comparison result.

21. The system according to claim 20, wherein
the comparator further has an input-pair switch disposed between the input pair of the differential amplifier; and
in the binary search, after an auto-zero mode in which the input-output switch and the input-pair switch are turned on, the comparator is controlled to the comparison mode, and in the comparison mode, the input-pair switch is set to off.

* * * * *